United States Patent
Marukame et al.

(10) Patent No.: US 7,973,351 B2
(45) Date of Patent: Jul. 5, 2011

(54) STACK HAVING HEUSLER ALLOY, MAGNETORESISTIVE ELEMENT AND SPIN TRANSISTOR USING THE STACK, AND METHOD OF MANUFACTURING THE SAME

(75) Inventors: Takao Marukame, Fuchu (JP); Mizue Ishikawa, Yokohama (JP); Tomoaki Inokuchi, Kawasaki (JP); Hideyuki Sugiyama, Kawasaki (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 12/565,303

(22) Filed: Sep. 23, 2009

(65) Prior Publication Data
US 2010/0072529 A1    Mar. 25, 2010

(30) Foreign Application Priority Data
Sep. 25, 2008   (JP) .................................. 2008-246718

(51) Int. Cl.
*H01L 21/02* (2006.01)

(52) U.S. Cl. .......... 257/295; 257/E29.323; 257/E43.004

(58) Field of Classification Search .................. 257/295, 257/E29.323, E44.004
See application file for complete search history.

(56) References Cited

U.S. PATENT DOCUMENTS

| | | | | |
|---|---|---|---|---|
| 2006/0227465 A1* | 10/2006 | Inokuchi et al. | ........... | 360/324.1 |
| 2006/0255383 A1* | 11/2006 | Kaiser et al. | .................. | 257/295 |
| 2007/0074317 A1* | 3/2007 | Pakala et al. | .................. | 977/935 |
| 2009/0050948 A1 | 2/2009 | Ishikawa et al. | | |
| 2009/0180215 A1 | 7/2009 | Ishikawa et al. | | |

FOREIGN PATENT DOCUMENTS

| | | |
|---|---|---|
| JP | 2006-32915 | 2/2006 |
| JP | 2006-295001 | 10/2006 |
| JP | 2007-250977 | 9/2007 |
| WO | WO 2005/088745 A1 | 9/2005 |

OTHER PUBLICATIONS

U.S. Appl. No. 12/561,475, filed Sep. 17, 2009, Tomoaki Inokuchi, et al.

N. Tezuka, et al., "Tunnel magnetoresistance for junctions with epitaxial full-Heusler $Co_2FeAl_{0.5}Si_{0.5}$ electrodes with $B2$ and $L2_1$ structures", Applied Physics Letters, vol. 89, 2006, pp. 112514-1 to 112514-3.

Office Action mailed Aug. 17, 2010, in Japanese Patent Application No. 2008-246718 (with English-language Translation).

* cited by examiner

*Primary Examiner* — Thomas L Dickey
*Assistant Examiner* — Nikolay Yushin
(74) *Attorney, Agent, or Firm* — Oblon, Spivak, McClelland, Maier & Neustadt, L.L.P.

(57) ABSTRACT

A stack includes a crystalline MgO layer, crystalline Heusler alloy layer, and amorphous Heusler alloy layer. The crystalline Heusler alloy layer is provided on the MgO layer. The amorphous Heusler alloy layer is provided on the crystalline Heusler alloy layer.

12 Claims, 7 Drawing Sheets

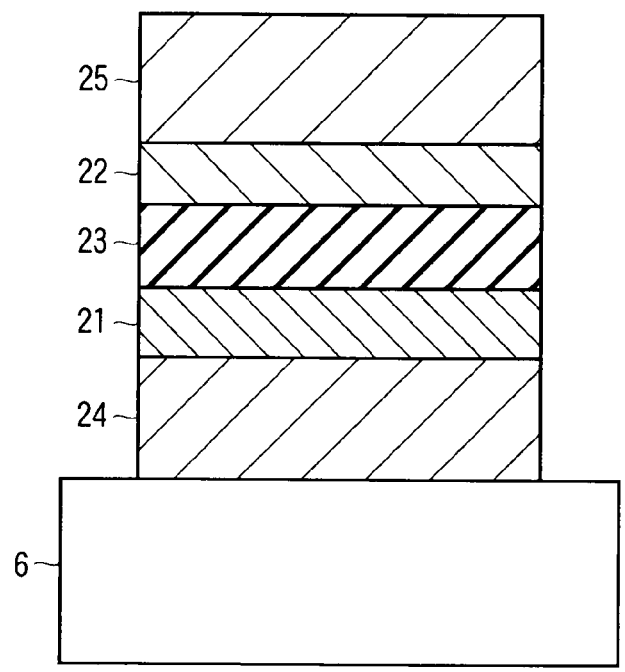
F I G. 9
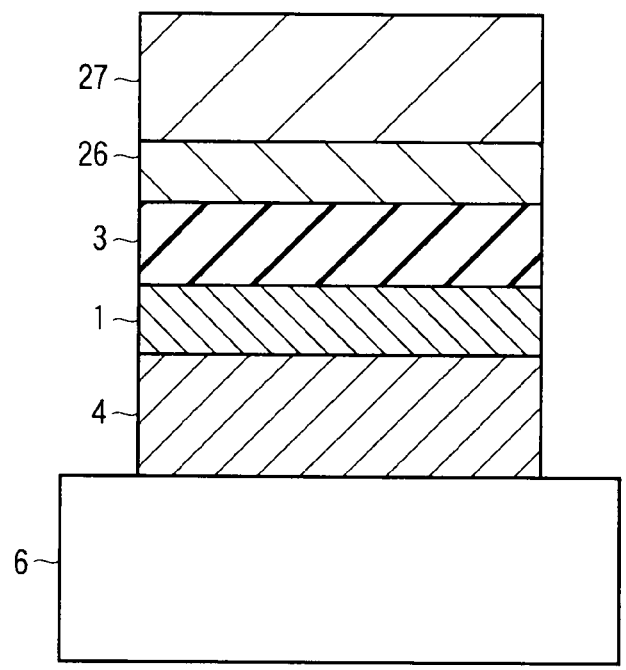
F I G. 10

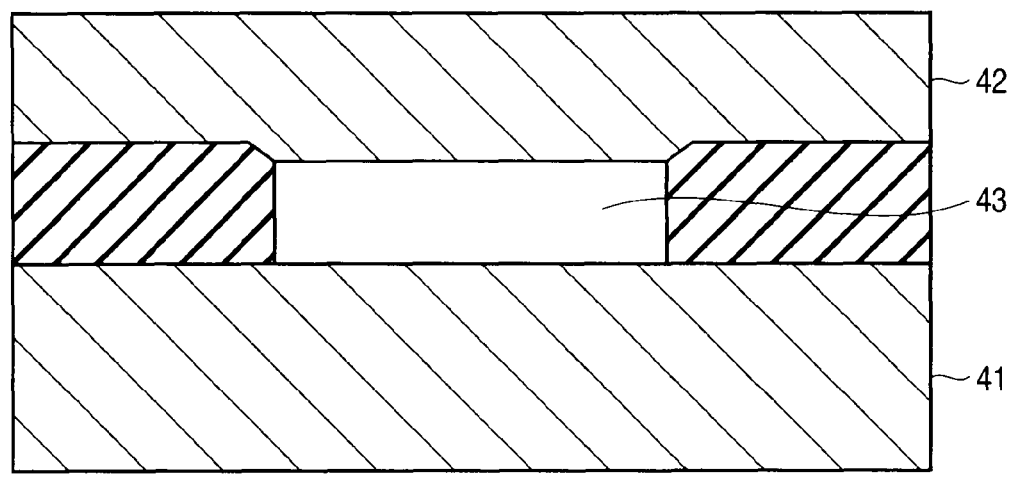
F I G. 13

STACK HAVING HEUSLER ALLOY, MAGNETORESISTIVE ELEMENT AND SPIN TRANSISTOR USING THE STACK, AND METHOD OF MANUFACTURING THE SAME

CROSS-REFERENCE TO RELATED APPLICATIONS

This application is based upon and claims the benefit of priority from prior Japanese Patent Application No. 2008-246718, filed Sep. 25, 2008, the entire contents of which are incorporated herein by reference.

BACKGROUND OF THE INVENTION

1. Field of the Invention

The present invention relates to a stack having a Heusler alloy, a magnetoresistive element and spin transistor using the stack, and a method of manufacturing the same.

2. Description of the Related Art

Recently, a magnetic memory device (magnetic random access memory [MRAM]) using, as a memory element, a magnetic tunnel junction (MTJ) element having a magnetic tunnel junction formed by a stacked structure of a ferromagnetic material layer/insulator layer (tunnel barrier)/ferromagnetic material layer has been proposed.

In this MRAM, the resistance of the stacked structure is changed by fixing magnetization direction (or majority spin axis) in one ferromagnetic material layer (a reference layer or fixed layer) and controlling magnetization direction (or majority spin axis) in the other ferromagnetic material layer (a recording layer or free layer), thereby storing a high-resistance state or low-resistance state as data "0" or "1". For example, the resistance is low when the spins in the reference layer and recording layer are parallel, and high when they are antiparallel.

The magnetoresistance ratio (MR ratio) of this MTJ element was a few 10% at room temperature a few years ago, but has reached 500% in recent years. This extends the possibility as various spin devices in addition to the MRAM. An example is a spin MOS field-effect transistor (spin MOSFET).

Although the MR ratio has increased as described above, it is necessary to further increase the MR ratio in order to achieve a high-efficiency magnetic memory device or spin MOSFET. Especially when applying the MTJ to a semiconductor device such as the MRAM or spin MOSFET, it is necessary to obtain a high MR ratio in a resistance region where a sheet resistance RA is about 10 $\Omega\mu m^2$. When the thickness of the tunnel barrier of an MTJ element by which an MR ratio of 500% is obtained is decreased in order to obtain RA=10 $\Omega\mu m^2$, the MR ratio decreases to 200%.

A promising approach for solving this problem is to use a ferromagnetic material having a high spin polarization (P) as the ferromagnetic material layer of the MTJ. According to the Julliere's law, the MR ratio is theoretically infinite if a half-metal material having P=100% is used. Candidates of this half-metal material are, e.g., $CrO_2$, $Fe_3O_4$, and a Heusler alloy. Recently, a Co-based Heusler alloy has achieved a high MR ratio, and spin devices using these materials are expected.

Furthermore, a device structure combining the Co-based Heusler alloy and a tunnel barrier made of magnesium oxide (MgO) in the MTJ is recently attracting attention (see, e.g., N. Tezuka, et al., Appl. Phys. Lett. 89 (2006) 112514). This combination of the Heusler alloy and MgO tunnel barrier is expected to be applied not only to the MTJ but also to the source/drain of the spin MOSFET.

Note that the Heusler alloy (also called a full-Heusler alloy) is a general term of intermetallic compounds having a chemical composition represented by $X_2YZ$. X is Co-, Fe-, Ni-, or Cu-based transition metal element or noble metal element on the periodic table. Y is an Mn-, V-, Cr-, or Ti-based transition metal, and can be the same element species as X. Z is a typical element of groups III to V. The Heusler alloy $X_2YZ$ can be classified into three types of crystal structures in accordance with the regularity of X.Y.Z. A structure having highest regularity in which the three elements can be distinguished from each other like X≠Y≠Z by analysis such as X-ray diffraction using the periodicity of a crystal is the $L2_1$ structure. A structure having second highest regularity in which X≠Y=Z is the B2 structure. A structure in which the three elements cannot be distinguished from each like X=Y=Z is the A2 structure.

To control a spin-polarized current by the gate voltage in the spin MOSFET, it is important to inject a current (to be also referred to as a highly spin-polarized current hereinafter) having a highly spin-polarized electron ratio into the channel from a magnetic material layer in the source. Also, in the spin MOSFET and MTJ, the magnetoresistive (MR) effect controlled by the relative magnetization directions in two magnetic material layers sandwiching a nonmagnetic layer is the basic operation principle of the device.

When performing spin transfer in a write method using spin transfer in the spin MOSFET and MTJ, no spin reversal occurs unless a current having a very high current density is supplied to the element. When a current having a high current density is supplied to a magnetoresistive effect element having a tunnel barrier layer, the element breaks because a high electric field is applied to the tunnel barrier. Therefore, a structure in which spin reversal occurs by a current having a low current density is required. Theoretically, a high spin polarization (P) is important for spin transfer as well. Furthermore, a Heusler alloy generally has small saturation magnetization and a small damping constant, and hence is a material advantageous for spin-transfer torque magnetization reversal.

As explained above, in the magnetoresistive effect element, magnetic memory device, and spin MOSFET, generation and injection of a highly spin-polarized current are essential to implement the device and improve its performance. One promising solution is an electrode structure combining a Heusler alloy and crystalline tunnel barrier.

Unfortunately, the spin polarization of a current realized by this structure strongly depends on the crystal regularity of a Heusler alloy. Theoretically, even a Heusler alloy exhibiting half-metal characteristics by the $L2_1$ structure takes the A2 structure depending on the formation conditions, and becomes the same as a normal ferromagnetic material. Also, to extract the properties as a magnetoresistance, a Heusler alloy must have the $L2_1$ structure in the interface in contact with a tunnel insulating film.

As a method of increasing the regularity of a Heusler alloy, a method of epitaxially growing a Heusler alloy on a substrate or buffering layer having high lattice matching with the Heusler alloy and annealing the Heusler alloy is known. That is, it is impossible to extract high performance from a device using a Heusler alloy without epitaxially growing it.

Unfortunately, this method has the problems that, e.g., the degree of freedom of selection of an underlying layer for forming a Heusler alloy is low, a high annealing temperature is necessary, and the number of times of annealing increases. Since most magnetic devices are formed on semiconductor integrated circuits, these technical problems interfere with device applications.

BRIEF SUMMARY OF THE INVENTION

According to a first aspect of the present invention, there is provided a stack comprising a crystalline MgO layer; a crystalline Heusler alloy layer on the MgO layer; and an amorphous Heusler alloy layer on the crystalline Heusler alloy layer.

According to a second aspect of the present invention, there is provided a magnetoresistive element comprising a crystalline first Heusler alloy layer and a crystalline second Heusler alloy layer; a first MgO layer between the first Heusler alloy layer and the second Heusler alloy layer; and an amorphous third Heusler alloy layer on the first Heusler alloy layer at a surface opposite to a surface on the side of the first MgO layer.

According to a third aspect of the present invention, there is provided a spin transistor comprising a source electrode, a drain electrode, and a gate electrode on a semiconductor substrate, wherein at least one of the source electrode and the drain electrode has a stack comprising a crystalline MgO layer; a crystalline Heusler alloy layer on the MgO layer; and an amorphous Heusler alloy layer on the crystalline Heusler alloy layer.

According to a fourth aspect of the present invention, there is provided a stack manufacturing method comprising forming an amorphous Heusler alloy layer; forming an MgO layer in contact with the Heusler alloy layer; and crystallizing the Heusler alloy layer by annealing from an interface between the Heusler alloy layer and the MgO layer.

BRIEF DESCRIPTION OF THE SEVERAL VIEWS OF THE DRAWING

FIG. 9 is a sectional view showing a magnetoresistive element of a fifth embodiment;

FIG. 10 is a sectional view showing a magnetoresistive element of a sixth embodiment;

FIG. 13 is a sectional view showing a magnetic head of a ninth embodiment.

DETAILED DESCRIPTION OF THE INVENTION

Figure 1:
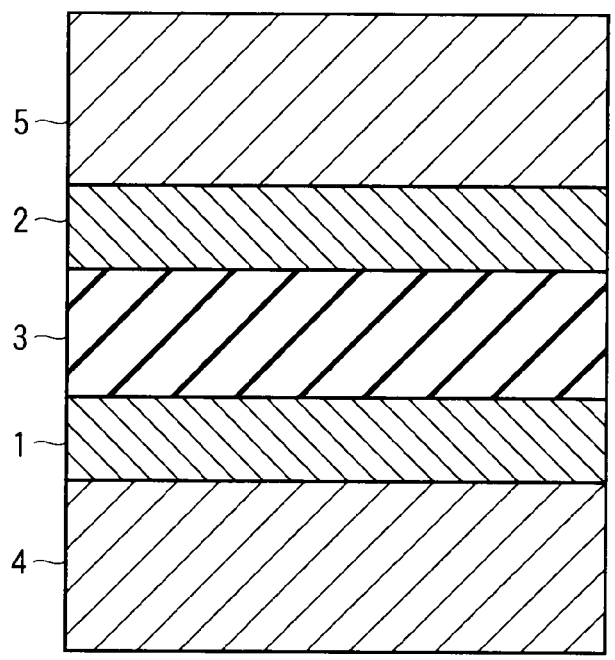
FIG. 1 is a sectional view showing a magnetoresistive element including a stack of a first embodiment.

Embodiments of the present invention will be explained below with reference to the accompanying drawing. In the following explanation, the same reference numerals denote the same parts throughout the drawing.

First Embodiment

First, a stack of the first embodiment of the present invention and a magnetoresistive element including the stack will be explained below.

FIG. 1 is a sectional view showing the structure of the magnetoresistive element including the stack of the first embodiment.

As shown in FIG. 1, the stack has a crystalline MgO layer 3, a crystalline Heusler alloy layer 1 formed in contact with the MgO layer 3, and an amorphous Heusler alloy layer 4 formed on that surface of the Heusler alloy layer 1, which is opposite to the surface on which the MgO layer 3 is formed. "Crystalline" includes a single crystal and polycrystal. The "crystal orientation" of a polycrystal indicates the crystal orientation in a crystal grain.

The magnetoresistive element including the above-mentioned stack is formed as follows. The crystalline MgO layer 3 is formed between the crystalline Heusler alloy layer 1 and a crystalline Heusler alloy layer 2. The amorphous Heusler alloy layer 4 is formed on that surface of the Heusler alloy layer 1, which is opposite to the surface on which the MgO layer 3 is formed. In addition, an amorphous Heusler alloy layer 5 is formed on that surface of the Heusler alloy layer 2, which is opposite to the surface on which the MgO layer 3 is formed.

The MgO layer 3 is a tunnel barrier layer having a tunnel barrier. The crystalline Heusler alloy layer 1 and amorphous Heusler alloy layer 4 form a first ferromagnetic material layer. The crystalline Heusler alloy layer 2 and amorphous Heusler alloy layer 5 form a second ferromagnetic material layer.

A method of manufacturing the magnetoresistive element including the stack of the first embodiment will be briefly explained below.

A Heusler alloy layer is formed by using a thin film obtained by mixing one or more types of additives such as boron (B), carbon (C), phosphorous (P), sulfur (S), arsenic (As), selenium (Se), and antimony (Sb) in a Heusler alloy $X_2YZ$, and amorphousizing the alloy. Letting 1−x be ($X_2YZ$) and x be the additive, a typical composition is that 1−x is 80 at % and x is 20 at %. A practical example is $(Co_2FeSi)_{80}P_{20}$. This will be referred to as a-$X_2YZ$ hereinafter. The additive species is a nonmagnetic element, desirably an element having a large diffusion coefficient in a Heusler alloy, and desirably has the effect of decreasing the crystallization temperature of a Heusler alloy. From this point of view, P and S are desirable among the additives described above.

Figure 2:
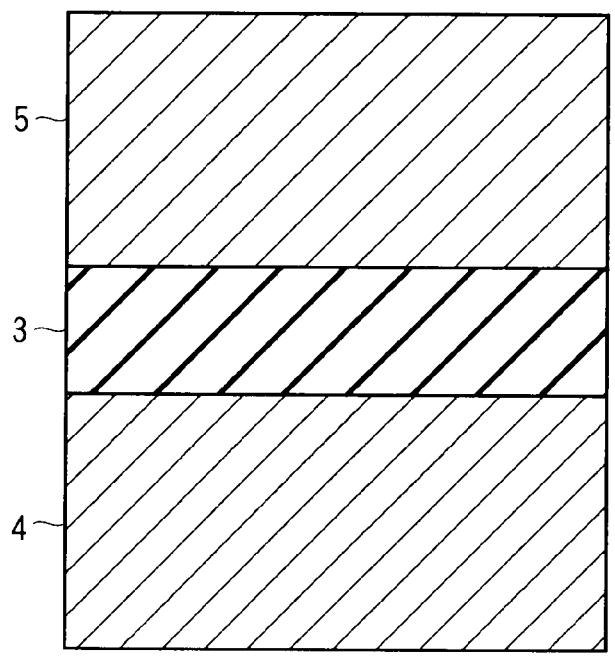
FIG. 2 is a sectional view showing a method of manufacturing the magnetoresistive element including the stack of the first embodiment.

First, the feature of the present invention is to form the a-$X_2YZ$ and MgO layer 3 in contact with each other. When forming, e.g., an MTJ, as shown in FIG. 2, a three-layered structure including an a-$X_2YZ$ layer 4/MgO layer 3/a-$X_2YZ$ layer 5 is formed. In this structure, the MgO layer 3 has grown as a (001) film even when the film thickness is 1 nm or less.

After that, annealing is performed. Consequently, lattice matching with MgO in the interfaces between the MgO layer 3 and a-$X_2YZ$ layers 4 and 5 changes the structure of the a-$X_2YZ$ to the original crystalline $X_2YZ$, thereby forming a (001) film by self-alignment by so-called, solid-phase epitaxial growth. That is, as shown in FIG. 1, an MTJ including the $X_2YZ$ layer 1 ((001) orientation)/MgO layer 3 ((001) orientation)/$X_2YZ$ layer 2 ((001) orientation) is formed in the interfaces near the MgO layer 3.

Figure 3:
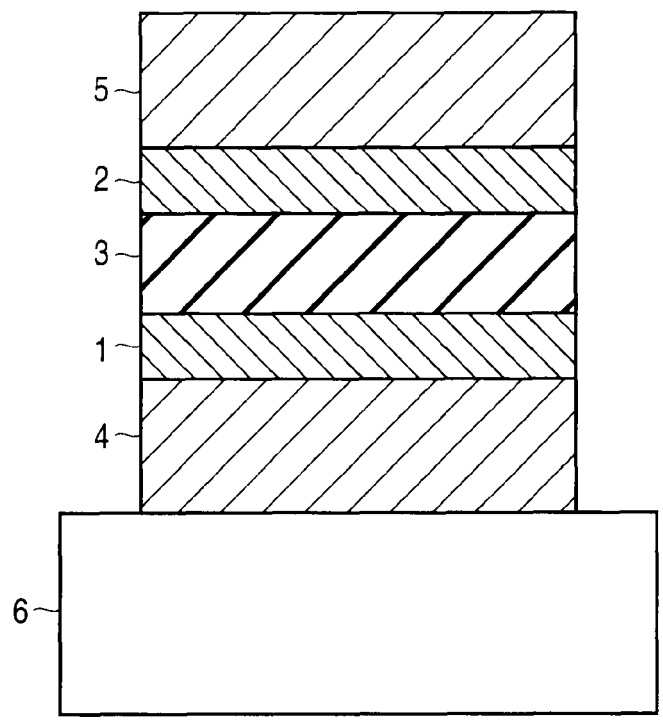
FIG. 3 is a sectional view showing the magnetoresistive element of the first embodiment.

The magnetoresistive element including the stack of the first embodiment of the present invention will be explained in detail below. FIG. 3 is a sectional view showing the structure of the magnetoresistive element including the stack of the first embodiment.

As shown in FIG. 3, an amorphous Heusler alloy layer 4 is formed on a silicon semiconductor substrate (or electrode) 6, and a crystalline Heusler alloy layer 1 is formed on the Heusler alloy layer 4. An MgO layer 3 is formed on the Heusler alloy layer 1. In addition, a crystalline Heusler alloy layer 2 is formed on the MgO layer 3, and an amorphous Heusler alloy layer 5 is formed on the Heusler alloy layer 2.

As described previously, the MgO layer 3 is a tunnel barrier layer having a tunnel barrier. The crystalline Heusler alloy layer 1 and amorphous Heusler alloy layer 4 form a first ferromagnetic material layer. The crystalline Heusler alloy layer 2 and amorphous Heusler alloy layer 5 form a second ferromagnetic material layer.

Details of the structure of the magnetoresistive element will be explained below by describing materials to be used.

Although the magnetoresistive element is formed on the silicon semiconductor substrate (or electrode) 6, it is also possible to use a silicon semiconductor substrate having a thermal oxide film as needed. Also, $Co_2MnSi$ is used as an example of a Co-based Heusler alloy. For example, a $Co_2MnSi$ layer is used as a crystalline Heusler alloy layer, and $(Co_2MnSi)_{80}S_{20}$ obtained by adding S to $Co_2MnSi$ is used as an amorphous Heusler layer (to be referred to as an amorphous layer hereinafter). Note that the additive to $Co_2MnSi$ is not limited to S, and it is also possible to add at least one of B, C, P, As, Se, and Sb instead of S.

From the underlying layer side of the semiconductor substrate 6, a Ta layer (50 nm) (not shown) is formed, and the amorphous layer 4 (5 nm)/$Co_2MnSi$ layer 1 (5 nm)/MgO layer 3 (2.0 nm)/$Co_2MnSi$ layer 2 (5 nm)/amorphous layer 5 (5 nm) are formed in this order. In addition, an Ru layer (0.9 nm)/CoFe layer (3 nm)/IrMn layer (10 nm)/Ru layer (5 nm)/Ta layer (50 nm) (none of them is shown) are formed in this order on the amorphous layer 5. The IrMn layer forms an antiferromagnetic material layer. Note that each parenthesized numerical value indicates the film thickness.

A method of manufacturing the magnetoresistive element of the first embodiment will now be explained.

That is, a method of forming the amorphous layer 4/$Co_2MnSi$ layer 1 and $Co_2MnSi$ layer 2/amorphous layer 5 sandwiching the MgO layer 3 will be described in detail below. First, the amorphous layer $((Co_2MnSi)_{80}S_{20}$ layer) 4 is deposited on the semiconductor substrate 6 by using sputtering. Note that the film formation method is not limited to sputtering, and may also be vacuum deposition, metal chemical vapor deposition (CVD), molecular beam epitaxy (MBE), or pulsed laser deposition (PLD). However, the method must be performed under conditions by which an amorphous layer grows.

Whether the amorphous layer was deposited was checked by reflection high-energy electron diffraction (RHEED) in the same chamber after film formation. Also, instead of the amorphous layer 4 described above, a 50-nm-thick $(Co_2MnSi)_{80}Si_{20}$ layer was deposited as a sample, and found to be amorphous by X-ray diffraction structure analysis (XRD). It is of course also possible to confirm the growth of an amorphous layer by observation with a transmission electron microscope (TEM). When TEM observation is performed, however, nanocrystals are sometimes observed in addition to an amorphous layer. The formation of the nanocrystals can be prevented by controlling the deposition conditions. For example, the $(Co_2MnSi)_{80}S_{20}$ layer was completely amorphousized by making the Ar gas pressure higher than 1 Pa during sputtering.

Then, the MgO layer 3 is deposited on the amorphous layer 4. The deposition conditions of the MgO layer 3 are optimized to obtain good (001) crystal orientation. For example, the layer is deposited by sputtering, and the Ar gas pressure and electric power are optimized. The values depend on the shape and volume of a chamber to be used for sputtering and the distance between the semiconductor substrate and a sputtering cathode. Therefore, it is unsubstantial to herein describe practical values. The film formation method of the MgO layer 3 is not limited to sputtering, and may also be, e.g., vacuum deposition, MBE, or PLD. When using any of these methods, the internal pressure of the chamber during deposition and the deposition rate are important. More specifically, a good result was obtained when the pressure was $10^{-6}$ Pa or less and the deposition rate was 0.1 Å/sec.

After the MgO layer 3 is deposited, the amorphous layer $((Co_2MnSi)_{80}S_{20}$ layer) 5 is deposited again. The $(Co_2MnSi)_{80}S_{20}$ layer 5 grows as an amorphous layer even on the MgO layer 3. The film was evaluated by RHEED, XRD, and TEM. Since the $(Co_2MnSi)_{80}S_{20}$ layer 5 was formed on the crystalline MgO layer 3, the $(Co_2MnSi)_{80}S_{20}$ layer 5 sometimes crystallized in the interface in contact with the MgO layer 3, unlike the $(Co_2MnSi)_{80}S_{20}$ layer 4 as an underlying layer. It is desirable to deposit the $(Co_2MnSi)_{80}S_{20}$ layer 5 by minimizing its crystallization. However, the $(Co_2MnSi)_{80}S_{20}$ layer on the interface side will eventually be crystallized by annealing after that. Therefore, the crystallization of the $(Co_2MnSi)_{80}S_{20}$ layer 5 in the upper portion is permissible depending on the required magnetoresistance. As described above, the $(Co_2MnSi)_{80}S_{20}$ layer 4/MgO layer 3/$(Co_2MnSi)_{80}S_{20}$ layer 5 are an amorphous layer/(001) layer/amorphous layer immediately after they are deposited. Initially implementing this structure is an important point and most notable feature of the embodiment of the present invention.

Subsequently, the amorphous $(Co_2MnSi)_{80}S_{20}$ layers 4 and 5 are crystallized by annealing. It was confirmed by TEM observation of samples formed by changing the temperature and time of annealing that the $(Co_2MnSi)_{80}S_{20}$ layers 4 and 5 gradually crystallized from the interfaces with the MgO layer 3. For example, a lamp heater of a film formation apparatus was used to form comparative examples by fixing the temperature at 300° C. and changing the annealing time from 1 minute to 1 hour.

These comparative examples revealed that the thickness of the crystallized layer in the $(Co_2MnSi)_{80}S_{20}$ layer increased in accordance with the annealing time. Also, when each sample was unloaded from the film formation apparatus and exposed to the atmosphere, and then processed by rapid thermal annealing (RTA), the $(Co_2MnSi)_{80}S_{20}$ layer similarly crystallized. Since heating is rapid in RTA, the dependence of crystallization on time is different. The annealing time and temperature need only be designed by considering their integrated amount (thermal budget).

The crystallized $(Co_2MnSi)_{80}S_{20}$ layers 1 and 2 lattice-matched the (001) MgO layer 3. Since the MgO layer 3 is a (001)-oriented (also called c-axis-oriented) polycrystal, the $(Co_2MnSi)_{80}S_{20}$ layers 1 and 2 are layers epitaxially grown in the interfaces of the crystal grains. Also, the $(Co_2MnSi)_{80}S_{20}$ layers 1 and 2 are initially amorphous and then crystallize and lattice-match by annealing, so they are formed by solid-phase epitaxial growth. As crystallization occurs in the interfaces, S as the additive reduces in the crystallized $(Co_2MnSi)_{80}S_{20}$ layers 1 and 2, and the concentration of S increases in the interfaces opposite to those in contact with the MgO layer 3. This tendency was observed by, e.g., P, B, and As as well as S.

As described above, the amorphous layer $((Co_2MnSi)_{80}S_{20})$ layer) 4 (5 nm)/$Co_2MnSi$ layer 1 (5 nm)/MgO layer 3 (2.0 nm)/$Co_2MnSi$ layer 2 (5 nm)/amorphous layer $((Co_2MnSi)_{80}S_{20}$ layer) 5 (5 nm) were formed by annealing. The $Co_2MnSi$ layers 1 and 2 in contact with the MgO layer 3 were checked by TEM observation and electron diffraction, and found to have the $L2_1$ structure.

Note that to obtain the crystalline MgO layer 3 when MgO is deposited, annealing may also be performed during or after film formation. In this case, solid-phase epitaxial growth occurs in the $(Co_2MnSi)_{80}S_{20}$ layer 4 in the interface between the $(Co_2MnSi)_{80}S_{20}$ layer 4 and MgO layer 3 when annealing is performed. This method may also be used if the number of times of annealing can be two.

In addition, a $Co_2MnSi$ layer (50 nm)/MgO layer (2.0 nm)/$Co_2MnSi$ layer (10 nm)/Ru layer (0.9 nm)/CoFe layer (3 nm)/IrMn layer (10 nm)/Ru layer (5 nm)/Ta layer (50 nm) were formed on an MgO substrate by epitaxial growth as a comparative example. After being formed, this comparative example was annealing in a magnetic field at 350° C. for 1 hour. After that, micropatterning was performed on samples having junction areas of 0.3×0.6 μm² to 1×2 μm², and the magnetoresistance ratio was measured in a magnetic field at room temperature.

Figure 4:
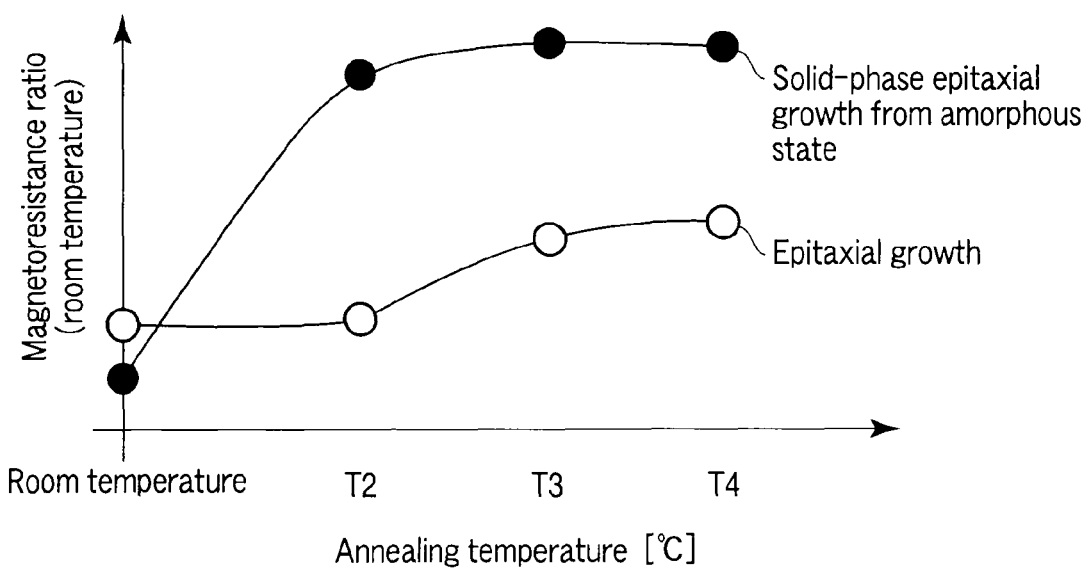
FIG. 4 is a graph showing experimental results obtained from the first embodiment and a comparative example.

FIG. 4 shows experimental results obtained from the first embodiment and comparative example. As shown in FIG. 4, the magnetoresistive element of this embodiment had, at room temperature, a magnetoresistance ratio higher than that of the comparative example formed by epitaxial growth from the beginning. Note that a single-crystal substrate was used in the comparative example in order to cause epitaxial growth in turn from the underlying layer.

Also, in the comparative example, it is necessary to improve the surface flatness by annealing whenever a layer is deposited from the underlying layer, and also improve the crystallinity. In the comparative example as described above, the growth conditions strongly depend on the underlying layer, and the number of times of the annealing process inevitably increases. Accordingly, the comparative example is disadvantageous in applications because the throughput of element formation is low, and this makes optimization of the conditions difficult.

In the magnetoresistive element of the first embodiment, one of the first ferromagnetic material layer (Heusler alloy layers 1 and 4) and second ferromagnetic material layer (Heusler alloy layers 2 and 5) is a recording layer (magnetization free layer) in which the magnetization direction is variable, and the other is a reference layer (magnetized fixed layer) in which the magnetization direction is invariable. The resistance value of the magnetoresistive element can be changed by changing the relative relationship between the magnetization directions in the recording layer and reference layer by, e.g., spin transfer or current-induced magnetic field application.

In the stack of the first embodiment as explained above, after an amorphous Heusler alloy layer is formed, the structure of this amorphous Heusler alloy layer is transferred to that of a crystalline Heusler alloy layer. This increases the degree of freedom of selection of the underlying layer, and makes it possible to decrease the annealing temperature and the number of times of annealing. In addition, a high spin polarization of a Heusler alloy can be used.

Also, in the magnetoresistive element of the first embodiment, the crystalline Heusler alloy layer obtained by structure transfer from the amorphous layer is formed in contact with the tunnel barrier layer. This makes it possible to form an electrode structure capable of efficient spin-polarized current injection, and obtain a high magnetoresistance ratio.

Second Embodiment

A spin MOSFET of the second embodiment of the present invention will be explained below.

Figure 5:
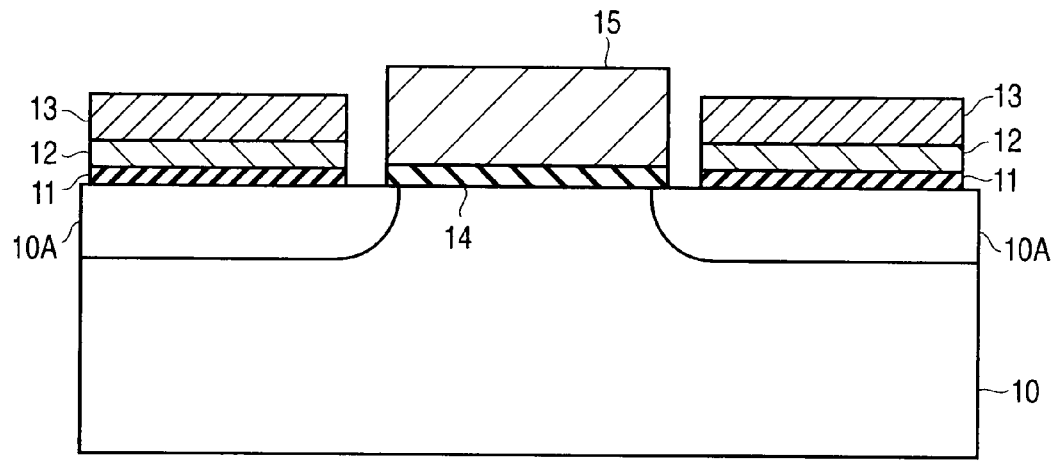
FIG. 5 is a sectional view showing a spin MOSFET of a second embodiment.

FIG. 5 is a sectional view showing the structure of the spin MOSFET of the second embodiment.

As shown in FIG. 5, impurity diffusion layers 10A as a source and drain are formed in the surface region of a semiconductor substrate 10 by ion implantation. MgO layers 11 are formed on the impurity diffusion layers 10A. Crystalline Heusler alloy layers 12 are formed on the MgO layers 11, and amorphous Heusler alloy layers 13 are formed on the Heusler alloy layers 12. In addition, a gate insulating film 14 is formed on the semiconductor substrate 10 between the source and drain, and a gate electrode 15 is formed on the gate insulating film 14. Note that the impurity diffusion layers 10A may also be omitted. Note also that the stacked structure of the MgO layer 11 and Heusler alloy layers 12 and 13 may also be formed on only one of the source and drain.

The MgO layer 11 is a tunnel barrier layer having a tunnel barrier. The crystalline Heusler alloy layer 12 and amorphous Heusler alloy layer 13 in one of the source and drain portions form a first ferromagnetic material layer, and the crystalline Heusler alloy layer 12 and amorphous Heusler alloy layer 13 in the other form a second ferromagnetic material layer.

In the spin MOSFET of the second embodiment, the Heusler alloy layers 12 and 13 in one of the source and drain portions form a recording layer (magnetization free layer) in which the magnetization direction is variable, and the Heusler alloy layers 12 and 13 in the other form a reference layer (magnetization fixed layer) in which the magnetization direction is invariable. It is only necessary to use a ferromagnetic material having high coercive force as the reference layer, or form an antiferromagnetic layer on the reference layer. The resistance value of the magnetoresistive element can be changed by changing the relative relationship between the magnetization directions in the recording layer and reference layer. The magnetization direction in the recording layer can be changed by using, e.g., spin transfer or current-induced magnetic field application performed via the channel or the like.

A method of manufacturing the spin MOSFET of the second embodiment will now be explained.

First, a channel region is formed in the semiconductor substrate 10 by ion implantation and annealing. After that, a silicon oxide film and polysilicon film, for example, are sequentially formed on the semiconductor substrate 10. Then, the silicon oxide film and polysilicon film are etched away from prospective source and drain portions on the semiconductor substrate 10, thereby forming the gate insulating film 14 and gate electrode 15 as shown in FIG. 5.

The impurity diffusion layers 10A are formed by ion implantation and annealing in the prospective source and drain portions of the surface region of the silicon semiconductor substrate 10. The MgO layers 11 are formed on the impurity diffusion layers 10A by sputtering. The amorphous Heusler alloy layers 13 are formed on the MgO layers 11 by sputtering. Annealing is then performed to crystallize each amorphous Heusler alloy layer 13 in the interface between the MgO layer 11 and Heusler alloy layer 13, thereby forming the crystalline Heusler alloy layer 12.

Subsequently, the MgO layers 11, crystalline Heusler alloy layers 12, and amorphous Heusler alloy layers 13 are patterned by liftoff, ion milling, reactive ion etching (RIE), or the like, thereby forming a source electrode and drain electrode. In this way, the spin MOSFET shown in FIG. 5 is manufactured.

As another manufacturing method, it is also possible to form holes having different areas in interlayer dielectric films (e.g., silicon oxide films) formed on the impurity diffusion layers 10A, bury films in these holes by high-pressure RF sputtering, and remove magnetic stacked films on the interlayer dielectric films by chemical mechanical polishing (CMP).

Details of this method of burying films in holes will be described below. A Local oxidation of silicon (LOCOS) for element isolation is formed, and a gate insulating film and gate electrode are formed. After that, ion implantation and RTA are performed in the same manner as in the conventional MOSFET manufacturing process. Then, interlayer dielectric films are formed and planarized to some extent by etch back. Subsequently, hole structures are formed by changing only the area without changing the aspect of the magnetoresistive elements in the source and drain portions. Then, the MgO layers 11 and amorphous Heusler alloy layers 13 are deposited and buried in these holes.

After that, annealing is performed to crystallize each amorphous Heusler alloy layer 13 in the interface between the MgO layer 11 and Heusler alloy layer 13, thereby forming the crystalline Heusler alloy layer 12. Then, extra portions of the MgO layers 11 and Heusler alloy layers 12 and 13 on the interlayer dielectric films are removed by CMP, and silicon oxide films are formed. In addition, via holes are formed in the silicon oxide films, and interconnections are formed. Note that the magnetoresistive elements (MTJ elements) in the source and drain portions were formed to have different areas. Therefore, the areas of the source and drain portions were measured by a shape SEM before the interconnections were formed. Consequently, the hole dimensions in the source portion were 0.3 µm×0.8 µm, and those in the drain portion were 0.8 µm×0.8 µm. The actual hole shapes were ellipses.

The structure of the magnetoresistive elements in the source and drain portions will be explained in detail below by describing materials to be used. On each impurity diffusion layer 10A, an $SiO_2$ layer (0.5 nm) (not shown) is formed first, and then the MgO layer 11 (0.5 nm)/$Co_2MnSi$ layer 12 (5 nm)/amorphous layer (($Co_2MnSi$)$_{80}S_{20}$ layer) 13 (5 nm) are formed in this order. In addition, an Ru layer (20 nm)/Ta layer (50 nm) (neither is shown) are formed in this order on the amorphous layer 13.

As a sample, a stacked structure including an $SiO_2$ layer (0.5 nm)/MgO layer (0.5 nm)/$Co_2MnSi$ layer (5 nm)/amorphous layer (($Co_2MnSi$)$_{80}S_{20}$ layer) (5 nm)/Ru layer (20 nm)/Ta layer (50 nm) was formed on a semiconductor substrate.

After that, to evaluate this embodiment, magnetic field write was performed by turning on the gate of the spin MOSFET, and the antiparallel state and parallel state of spins were obtained by the coercive force difference between the magnetic materials in the source and drain, thereby measuring the magnetoresistance ratio. In the spin MOSFET of this embodiment having the magnetoresistive element in which the ferromagnetic material layer was made of the Heusler alloy layer/amorphous layer, a high magnetoresistance ratio was obtained via the silicon semiconductor at room temperature. A similar tendency was obtained in a p-type spin MOSFET in which a pnp junction was formed in a silicon semiconductor substrate as well.

In the second embodiment, magnetoresistive elements having an electrode structure capable of efficient spin-polarized current injection are formed in the source and drain portions. This makes it possible to implement a spin MOSFET including a magnetoresistive element having a high magnetoresistance ratio.

Third Embodiment

A magnetoresistive element of the third embodiment of the present invention will be explained below.

Figure 6:
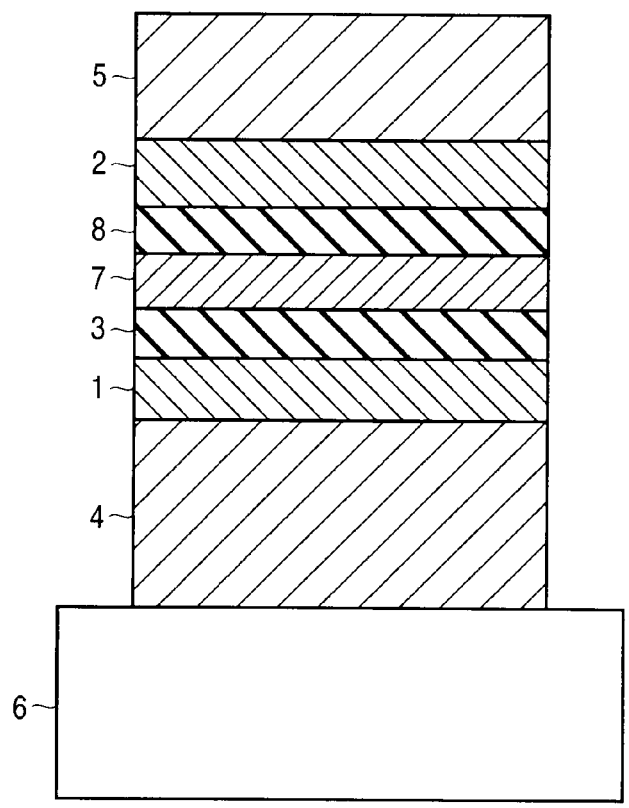
FIG. 6 is a sectional view showing a magnetoresistive element of a third embodiment.

FIG. 6 is a sectional view showing the structure of the magnetoresistive element of the third embodiment. The magnetoresistive element of the third embodiment includes a double-junction structure (double junction) having two MgO layers as tunnel barrier layers.

A stacked structure in which a crystalline MgO layer 3, Heusler alloy layer 7, and crystalline MgO layer 8 are stacked in this order is formed between crystalline Heusler alloy layers 1 and 2. An amorphous Heusler alloy layer 4 is formed on that surface of the Heusler alloy layer 1, which is opposite to the surface on which the MgO layer 3 is formed. In addition, an amorphous Heusler alloy layer 5 is formed on that surface of the Heusler alloy layer 2, which is opposite to the surface on which the MgO layer 8 is formed. The magnetoresistive element having this structure is formed on a silicon semiconductor substrate (or electrode) 6.

The MgO layers 3 and 8 are tunnel barrier layers having tunnel barriers. The crystalline Heusler alloy layer 1 and amorphous Heusler alloy layer 4 form a first ferromagnetic material layer. The crystalline Heusler alloy layer 2 and amorphous Heusler alloy layer 5 form a second ferromagnetic material layer.

Details of the structure of the magnetoresistive element will be explained below by describing materials to be used.

As shown in FIG. 6, the magnetoresistive element is formed on the silicon semiconductor substrate (or electrode) 6. It is also possible to use a silicon semiconductor substrate having a thermal oxide film as needed. Also, $Co_2FeSi$ is used as an example of a Co-based Heusler alloy. For example, a $Co_2FeSi$ layer is used as a crystalline Heusler alloy layer, and a ($Co_2FeSi$)$_{80}P_{20}$ layer obtained by adding P to $Co_2FeSi$ is used as an amorphous Heusler alloy layer (to be referred to as an amorphous layer hereinafter). Note that the additive to $Co_2FeSi$ is not limited to P, and it is also possible to add at least one of B, C, S, As, Se, and Sb instead of P.

From the underlying layer side of the semiconductor substrate 6, a Ta layer (50 nm) (not shown) is formed, and the amorphous layer 4 (5 nm)/$Co_2FeSi$ layer 1 (5 nm)/MgO layer 3 (1.0 nm)/$Co_2FeSi$ layer 7/amorphous layer 7/$Co_2FeSi$ layer 7/MgO layer 8 (1.0 nm)/$Co_2FeSi$ layer 2 (5 nm)/amorphous layer 5 (5 nm) are formed in this order. In addition, an Ru layer (0.9 nm)/CoFe layer (3 nm)/IrMn layer (10 nm)/Ru layer (5 nm)/Ta layer (50 nm) (none of them is shown) are formed in this order on the amorphous layer 5. The IrMn layer forms an antiferromagnetic material layer. Note that each parenthesized numerical value indicates the film thickness.

A method of manufacturing the magnetoresistive element of the third embodiment will now be explained. This manufacturing method is basically the same as that of the first embodiment, and only a method of forming the Heusler alloy layer (interlayer) 7 will be described in detail below.

After the lower MgO layer 3 is deposited, an amorphous layer (($Co_2FeSi$)$_{80}P_{20}$ layer) as an interlayer is deposited. The film thickness of the interlayer can be about 10 nm, and can also be about 5 nm in order to completely crystallize the interlayer. However, the film thickness must be larger than a lattice constant of about 0.57 nm of a Heusler alloy. The film formation method can be sputtering, i.e., need not be changed although the layer is an interlayer. The method is not limited to sputtering and may also be vacuum deposition, metal CVD, MBE, or PLD, but it is important to initially grow an amorphous layer. This is so because if crystallization occurs, the deposited film grows in the form of islands when the film thickness is 5 nm or less.

Whether the ($Co_2FeSi$)$_{80}P_{20}$ layer was deposited as an amorphous layer was checked by reflection high-energy electron diffraction (RHEED) in the same chamber after film formation. Also, instead of the ($Co_2FeSi$)$_{80}P_{20}$ layer as an interlayer, a 50-nm-thick ($Co_2FeSi$)$_{80}P_{20}$ layer was deposited as a sample and found to be an amorphous layer by X-ray diffraction structure analysis (XRD).

After that, the MgO layer 8 is deposited on the amorphous layer as an interlayer. In addition, the upper amorphous layer (($Co_2FeSi$)$_{80}P_{20}$ layer) 5 is deposited on the MgO layer 8. Subsequently, annealing is performed to crystallize the ($Co_2FeSi$)$_{80}P_{20}$ layers 4, 7, and 5. The upper, middle, and lower ($Co_2FeSi$)$_{80}P_{20}$ layers gradually crystallize from the interfaces with the MgO layers 3 and 8. During the crystallization, P in the ($Co_2FeSi$)$_{80}P_{20}$ layer as an interlayer moves away from the interfaces, and forms a high-concentration region in the center of the film. This increase in P concentration hardly decreases the magnetoresistance, and has the effect of changing the magnetic properties and reducing the saturation magnetization (Ms). The reduction in saturation magnetization is useful for spin-transfer torque magnetization reversal.

Also, composition analysis in the direction of depth revealed that P in the ($Co_2FeSi$)$_{80}P_{20}$ layer as an interlayer vertically diffused through the MgO layers 3 and 8. Thus, the additive used for amorphousization readily diffuses. Although the additive remains in the interface between the MgO layer and $(Co_2FeSi)_{80}P_{20}$ layer, this additive does not largely decrease the magnetoresistance.

In the third embodiment, in the interface between a Heusler alloy layer and MgO layer, a high-quality interface is formed between a full-Heusler alloy layer having the $L2_1$ structure and the MgO layer by solid-phase epitaxial growth. This effectively makes the magnetoresistance ratio higher than that in the conventional method of epitaxially growing layers from the underlying layer.

Also, when an element has a double-junction structure as in the third embodiment, a voltage to be applied to the whole element reduces by half. Consequently, the decrease in magnetoresistance depending on the voltage is gentler than that in the first embodiment. Furthermore, when the film thickness of the Heusler alloy layer (interlayer) 7 is appropriately designed, a spin resonance state appears. This makes it possible to obtain magnetic resonance amplification oscillatory in the voltage dependence. The rest of the arrangement and effects are the same as those of the first embodiment.

Fourth Embodiment

A magnetoresistive element of the fourth embodiment of the present invention will be explained below.

Figure 7:
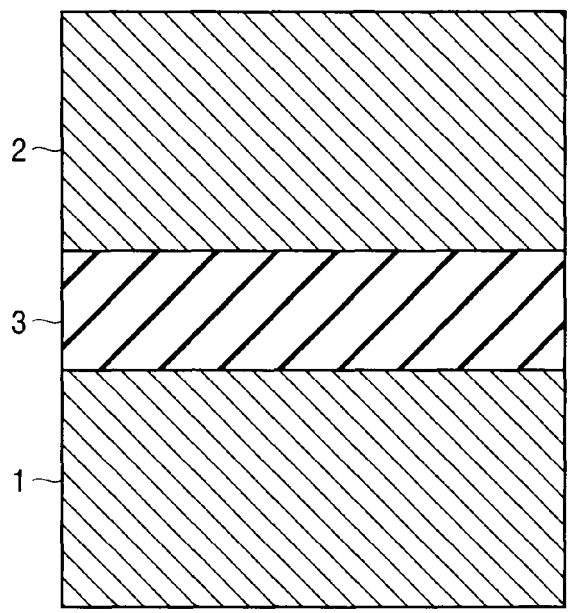
FIG. 7 is a sectional view showing a magnetoresistive element of a fourth embodiment.

FIG. 7 is a sectional view showing the structure of the magnetoresistive element of the fourth embodiment. In the magnetoresistive element of the fourth embodiment, amorphous Heusler alloy layers sandwiching an MgO layer 3 entirely crystallize to form crystalline Heusler alloy layers 1 and 2. That is, the crystalline MgO layer 3 is formed between the crystalline Heusler alloy layers 1 and 2.

Details of the structure of the magnetoresistive element will be explained below by describing materials to be used. In this embodiment, $Co_2Fe(Al,Si)$ is used as an example of a Co-based Heusler alloy.

From the underlying layer side of the magnetoresistive element, a Ta layer (50 nm) (not shown) is formed, and the $Co_2Fe(Al,Si)$ layer 1 (5 nm)/MgO layer 3 (1.0 nm)/$Co_2Fe(Al,Si)$ layer 2 (5 nm) are formed in this order. In addition, an Ru layer (0.9 nm)/CoFe layer (3 nm)/IrMn layer (10 nm)/Ru layer (5 nm)/Ta layer (50 nm) (none of them is shown) are formed in this order on the $Co_2Fe(Al,Si)$ layer 2. The IrMn layer forms an antiferromagnetic material layer. Note that each parenthesized numerical value indicates the film thickness.

A method of manufacturing the magnetoresistive element of the fourth embodiment will now be explained. This manufacturing method is basically the same as that of the first embodiment except for a step of crystallizing an amorphous Heusler alloy layer (amorphous layer), so only this step will be described in detail below. In this embodiment, a $(Co_2Fe(Al,Si))_{80}As_{20}$ layer obtained by adding As to $Co_2Fe(Al,Si)$ is used as an amorphous layer. Note that the additive to $Co_2Fe(Al,Si)$ is not limited to As, and it is also possible to add at least one of B, C, P, S, Se, and Sb instead of As.

A lower amorphous layer ($(Co_2Fe(Al,Si))_{80}As_{20}$ layer) is deposited, and the MgO layer 3 is formed on this amorphous layer. An upper amorphous layer ($(Co_2Fe(Al,Si))_{80}As_{20}$ layer) is deposited on the MgO layer 3. The upper and lower amorphous layers are crystallized by annealing. The upper and lower amorphous layers gradually crystallize from the interfaces with the MgO layer 3. When the upper and lower amorphous layers are deposited to have a thickness of about 5 nm, the amorphous layers almost entirely crystallize by annealing.

Figure 8:
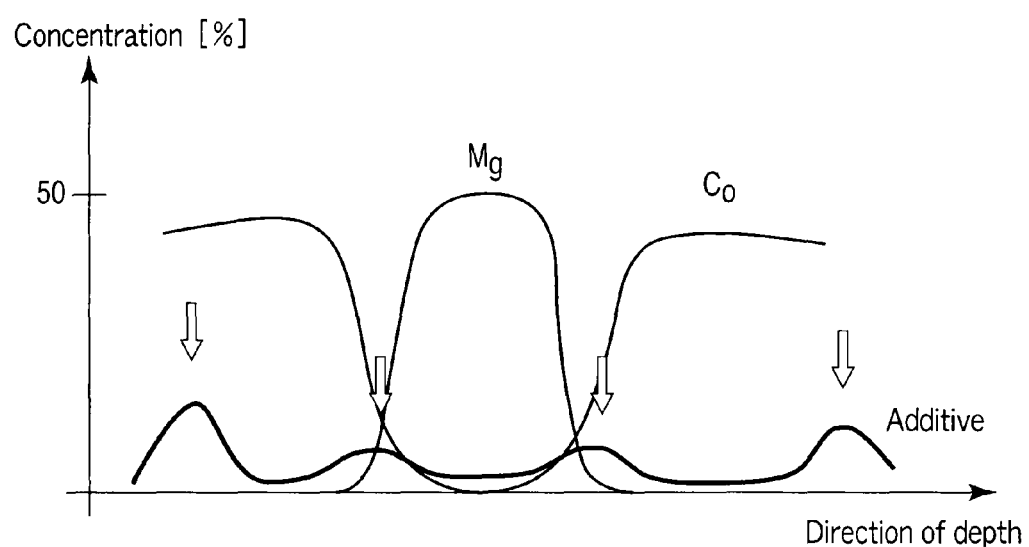
FIG. 8 is a graph showing the additive concentration in the direction of depth of the magnetoresistive element of the fourth embodiment.

Accordingly, the Heusler alloy layers 1 and 2 sandwiching the MgO layer 3 have a crystallized structure. However, the residual amorphous layers existed in the Heusler alloy layers 1 and 2. The Heusler alloy layer was in contact with the Ta layer or Ru layer on the surface opposite to the surface in contact with the MgO layer. Consequently, as shown in FIG. 8, an orientation-free polycrystalline or amorphous region remained near the interface with the Ta layer or Ru layer. Although a small amount of the additive was contained in the Heusler alloy layers 1 and 2 as well, the content of the additive was larger near this interface, and this produced a concentration peak. Note that the residual amorphous region has no large effect on the magnetoresistance in a position far from the MgO layer 3. On the contrary, it is important that the thickness of the crystallized region in contact with the MgO layer 3 be larger than the spin diffusion length (typically, 3 to 5 nm) of a Heusler alloy. Small concentration peaks of the additive are also produced near the interfaces between the MgO layer 3 and Heusler alloy layers 1 and 2, but the influence of these peaks is insignificant.

In the fourth embodiment, solid-phase epitaxial growth of the Heusler alloy layers 1 and 2 forms a high-quality interface between a full-Heusler alloy layer having the $L2_1$ structure and an MgO layer. This makes it possible to increase the spin polarization of a Heusler alloy, and obtain a high magnetoresistance ratio.

In addition, lattice matching improves in the interface between the Heusler alloy layer and MgO layer. Accordingly, it is possible to obtain the effect of reducing the dependence of the magnetoresistance on the temperature and voltage caused by spin flip resulting from an interface impurity. The rest of the arrangement and effects are the same as those of the first embodiment.

Fifth Embodiment

A magnetoresistive element of the fifth embodiment of the present invention will be explained below.

FIG. 9 is a sectional view showing the structure of the magnetoresistive element of the fifth embodiment. In the fifth embodiment, a Heusler alloy layer formed by epitaxial growth is used as a buffering layer 24 as an underlying layer.

A crystalline MgO layer 23 is formed between crystalline Heusler alloy layers 21 and 22. The buffering layer 24 is formed on that surface of the Heusler alloy layer 21, which is opposite to the surface on which the MgO layer 23 is formed. In addition, an amorphous Heusler alloy layer 25 is formed on that surface of the Heusler alloy layer 22, which is opposite to the surface on which the MgO layer 23 is formed. A magnetoresistive element having this structure is formed on a silicon semiconductor substrate (or electrode) 6.

The MgO layer 23 is a tunnel barrier layer having a tunnel barrier. The crystalline Heusler alloy layer 21 and buffering layer 24 form a first ferromagnetic material layer. The crystalline Heusler alloy layer 22 and amorphous Heusler alloy layer 25 form a second ferromagnetic material layer.

Details of the structure of the magnetoresistive element will be explained below by describing materials to be used as the first and second ferromagnetic layers. In this embodiment, $Co_2(Mn,Fe)Si$ is used as an example of a Co-based Heusler alloy. The composition ratio of Mn to Fe is, e.g., 50:50. For example, a $Co_2(Mn,Fe)Si$ layer is used as a crystalline Heusler alloy layer, and a $(Co_2(Mn,Fe)Si)_{80}B_{20}$ layer obtained by adding B to $Co_2(Mn,Fe)Si$ is used as an amorphous Heusler alloy layer (to be referred to as an amorphous layer hereinafter). Note that the additive to $Co_2(Mn,Fe)Si$ is not limited to B, and it is also possible to add at least one of C, P, S, As, Se, and Sb instead of B. In addition, a $Co_2MnGe$ layer is used as a buffering layer.

From the underlying layer side of a (001) silicon semiconductor substrate 20, an MgO layer (not shown) is formed by epitaxial growth, and the $Co_2MnGe$ layer 24 (50 nm)/$Co_2(Mn,Fe)Si$ layer 21/MgO layer 23 (1.0 nm)/$Co_2(Mn,Fe)Si$ layer 22 (5 nm)/amorphous layer 25 are formed in this order. In addition, an Ru layer (0.9 nm)/CoFe layer (3 nm)/IrMn layer (10 nm)/Ru layer (5 nm)/Ta layer (50 nm) (none of them is shown) are formed in this order on the amorphous layer 25. The IrMn layer forms an antiferromagnetic material layer. Note that each parenthesized numerical value indicates the film thickness.

A method of manufacturing the magnetoresistive element of the fifth embodiment will now be explained. This manufacturing method is basically the same as that of the first embodiment except for a step of forming a buffering layer as an underlying layer, and a step of forming a $Co_2(Mn,Fe)Si$ layer on the buffering layer. Therefore, only these steps will be described below.

The (001) silicon semiconductor substrate 20 is cleaned with dilute hydrofluoric acid, thereby forming a hydrogen-terminated silicon surface. The semiconductor substrate 20 is set in a vacuum film formation apparatus and annealed in an ultrahigh vacuum at 400° C. or more, thereby cleaning the hydrogen-terminated surface. This annealing at 400° C. or more is unnecessary depending on the conditions of MgO film formation to be performed after that.

An MgO layer is deposited on the semiconductor substrate 20 by the same method as that used to form the MgO layer in the first embodiment, e.g., sputtering, thereby forming an epitaxial film. After that, a $Co_2MnGe$ layer is deposited on the MgO layer by sputtering, thereby forming the epitaxially grown buffering layer 24. Similar to the Heusler alloy in the first embodiment, this $Co_2MnGe$ layer need not be deposited by sputtering. The lattice relationships in the film structure formed up to this point are all (001) single-crystal growth. To obtain a flat $Co_2MnGe$ layer, annealing is continuously performed at about 500° C. for 15 minutes after deposition in a vacuum.

Subsequently, a $(Co_2(Mn,Fe)Si)_{80}B_{20}$ layer serving as the Heusler alloy layer 21 is deposited on the buffering layer ($Co_2MnGe$ layer) 24 by sputtering. The surface state or lattice matching of the $Co_2MnGe$ layer as an underlying layer determines whether the $(Co_2(Mn,Fe)Si)_{80}B_{20}$ layer becomes amorphous immediately after deposition. When forming the $Co_2MnGe$ layer and $(Co_2(Mn,Fe)Si)_{80}B_{20}$ layer of this embodiment, the $(Co_2(Mn,Fe)Si)_{80}B_{20}$ layer becomes amorphous. The $(Co_2(Mn,Fe)Si)_{80}B_{20}$ layer may also be epitaxially grown into a single-crystal layer.

After that, the MgO layer 23/$(Co_2(Mn,Fe)Si)_{80}B_{20}$ layer 25 are deposited in this order as in the first embodiment. Annealing is then performed to crystallize the lower $(Co_2(Mn,Fe)Si)_{80}B_{20}$ layer and upper $(Co_2(Mn,Fe)Si)_{80}B_{20}$ layer 25. The upper and lower $(Co_2(Mn,Fe)Si)_{80}B_{20}$ layers gradually crystallize from the interfaces with the MgO layer 23.

When the $(Co_2(Mn,Fe)Si)_{80}B_{20}$ layer as the Heusler alloy layer 21 was deposited by decreasing its thickness to about 1.5 nm, i.e., by making the thickness much less than the spin relaxation length of $Co_2(Mn,Fe)Si$, the electron structure of the underlying $Co_2MnGe$ layer was reflected on the magnetoresistance more than that of $Co_2(Mn,Fe)Si$. By contrast, when the thickness of the $(Co_2(Mn,Fe)Si)_{80}B_{20}$ layer was increased to about 5 nm, $Co_2(Mn,Fe)Si$ was reflected on the magnetoresistance characteristics.

The magnetoresistance characteristics can be modulated by changing the film thickness of the $(Co_2(Mn,Fe)Si)_{80}B_{20}$ layer as the Heusler alloy layer 21 within the above range (1.5 to 5 nm). Also, the dependence of the magnetoresistance of the magnetoresistive element on the temperature and voltage can be controlled by the position of the Fermi level in the energy gap of a minority spin band (minority spin, down spin) in the electron structure of a Heusler alloy.

In the fifth embodiment, the electron structure of the Heusler alloy layer 21 can be controlled. The rest of the arrangement and effects are the same as those of the first embodiment.

Sixth Embodiment

A magnetoresistive element of the sixth embodiment of the present invention will be explained below.

FIG. 10 is a sectional view showing the structure of the magnetoresistive element of the sixth embodiment. In the sixth embodiment, a stacked structure of a crystalline Heusler alloy layer 1 and amorphous Heusler alloy layer 4 is formed on one surface of an MgO layer (tunnel barrier layer) 3, and a stacked structure of a crystalline Heusler alloy layer 26 and electrode layer 27 is formed on the other surface.

The crystalline MgO layer 3 is formed between the crystalline Heusler alloy layers 1 and 26. The amorphous Heusler alloy layer 4 is formed on that surface of the Heusler alloy layer 1, which is opposite to the surface on which the MgO layer 3 is formed. In addition, the electrode layer 27 is formed on that surface of the Heusler alloy layer 26, which is opposite to the surface on which the MgO layer 3 is formed. A magnetoresistive element having this structure is formed on a silicon semiconductor substrate (or electrode) 6.

The MgO layer 3 is a tunnel barrier layer having a tunnel barrier. The crystalline Heusler alloy layer 1 and amorphous Heusler alloy layer 4 form a first ferromagnetic material layer. The crystalline Heusler alloy layer 26 and electrode layer 27 form a second ferromagnetic material layer.

Details of the structure of the magnetoresistive element will be explained below by describing materials to be used. In this embodiment, $Co_2MnSi$ is used as an example of a Co-based Heusler alloy. For example, a $Co_2MnSi$ layer is used as a crystalline Heusler alloy layer, and a $(Co_2MnSi)_{80}B_{20}$ layer obtained by adding B to $Co_2MnSi$ is used as an amorphous Heusler alloy layer (to be referred to as an amorphous layer hereinafter). Note that the additive to $Co_2MnSi$ is not limited to B, and it is also possible to add at least one of C, P, S, As, Se, and Sb instead of B.

From the underlying layer side of a silicon semiconductor substrate 6, a Ta layer (50 nm) (not shown) is formed, and the amorphous layer 4 (5 nm)/$Co_2MnSi$ layer 1 (5 nm)/MgO layer 3 (2.0 nm)/$Co_2MnSi$ layer 26 (5 nm) are formed in this order. In addition, an Ru layer (0.9 nm)/CoFe layer (3 nm)/IrMn layer (10 nm)/Ru layer (5 nm)/Ta layer (50 nm) are formed in this order as the electrode layer 27 on the $Co_2MnSi$ layer 26.

A manufacturing method of the sixth embodiment is basically the same as that of the first embodiment except for a step of forming a $Co_2MnSi$ layer not containing B on the MgO layer 3. Therefore, only this step will be described below.

The $Co_2MnSi$ layer 26 is deposited on the MgO layer 3 by using a $Co_2MnSi$ target having a stoichiometric composition. It was confirmed by RHEED that the $Co_2MnSi$ layer 26 was epitaxially grown on the MgO layer 3. Even when using an amorphous layer of CoFeB or a crystalline layer of CoFe or Fe as the $Co_2MnSi$ layer 26, the magnetoresistance change ratio was found to be 100% or more.

As described above, it is possible to form an electrode structure capable of efficient spin-polarized current injection even when using the crystalline Heusler alloy layer 1 and amorphous Heusler alloy layer 4 only below the MgO layer (tunnel barrier layer) 3, and using the crystalline Heusler alloy layer 26 above the MgO layer 3, and obtain a high magnetoresistance change ratio. The rest of the arrangement and effects are the same as those of the first embodiment.

Seventh Embodiment

Examples in which the concentration of an additive in an amorphous layer of a magnetoresistive element is changed will be explained below as the seventh embodiment of the present invention.

In each of the above-mentioned embodiments, the atomic ratios of a Heusler alloy and additive in an amorphous layer are respectively 80% and 20%. Also, sputtering is performed using one alloy target. This embodiment provides a method of forming a completely amorphous layer by increasing the concentration of an additive in the amorphous layer.

The present inventors made extensive studies and found that when $Co_2FeSi$ and As were used and the atomic ratio of As was 20% or more, a sputtering target formed by vacuum melting cracked. This problem arose even when $Co_2MnSi$ was used instead of $Co_2FeSi$ or B was added.

In this embodiment, therefore, an amorphous layer was formed by co-sputtering using two or more sputtering cathodes. In the first examination, the B concentration was adjusted by using $(Co_{50}Fe_{50})B$ and CoSi. Consequently, it was possible to add B at a concentration of 20% or more, and X was 20% or more in $(Co_2FeSi)_{1-X}B_X$. In the next examination, the P concentration was adjusted by using $(Co_{75}Fe_{25})P$ and CoFeSi. Consequently, it was possible to raise the P concentration X to 20% or more in $(Co_2FeSi)_{1-X}P_X$ in this case as well.

The structure of the magnetoresistive element was the same as that of the first embodiment. As shown in FIG. 3, the magnetoresistive element was formed on a semiconductor substrate 6. The rest of the manufacturing method except for $(Co_2FeSi)_{1-X}P_X$ is the same as that of the first embodiment, so a repetitive explanation will be omitted. Also, the rest of the arrangement and effects are the same as those of the first embodiment.

Note that the examples in which the concentration of the additive in the amorphous layer was set at 20% or more have been explained in this embodiment, but the concentration of the additive in the amorphous layer can be changed within the range of 5% to 50% in each embodiment of the present invention. That is, letting $X_2YZ$ be a Heusler alloy and q be an additive, the concentration of the additive q can be changed within the range of $(X_2YZ)_{95}q_5$ to $(X_2YZ)_{50}q_{50}$. The additive q is at least one element selected from B, C, P, S, As, Se, and Sb. The same effects as in each embodiment can be obtained by this arrangement as well.

Figure 11:
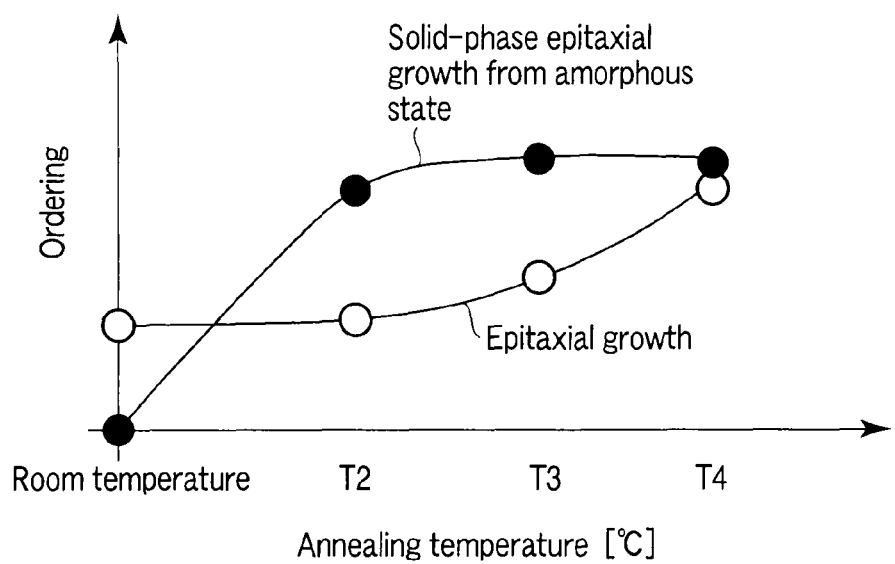
FIG. 11 is a graph showing the crystal regularity of a Heusler alloy formed by solid-phase epitaxial growth in each embodiment.

As shown in FIG. 11, in the Heusler alloy formed by solid-phase epitaxial growth from the amorphous state in each embodiment described above, ordering of the $L2_1$ structure occurred by annealing at a temperature lower than that when the alloy was formed by epitaxial growth.

Eighth Embodiment

An MRAM of the eighth embodiment of the present invention will be explained below. The magnetoresistive element of each embodiment described above is used in a memory cell of this MRAM.

Figure 12:
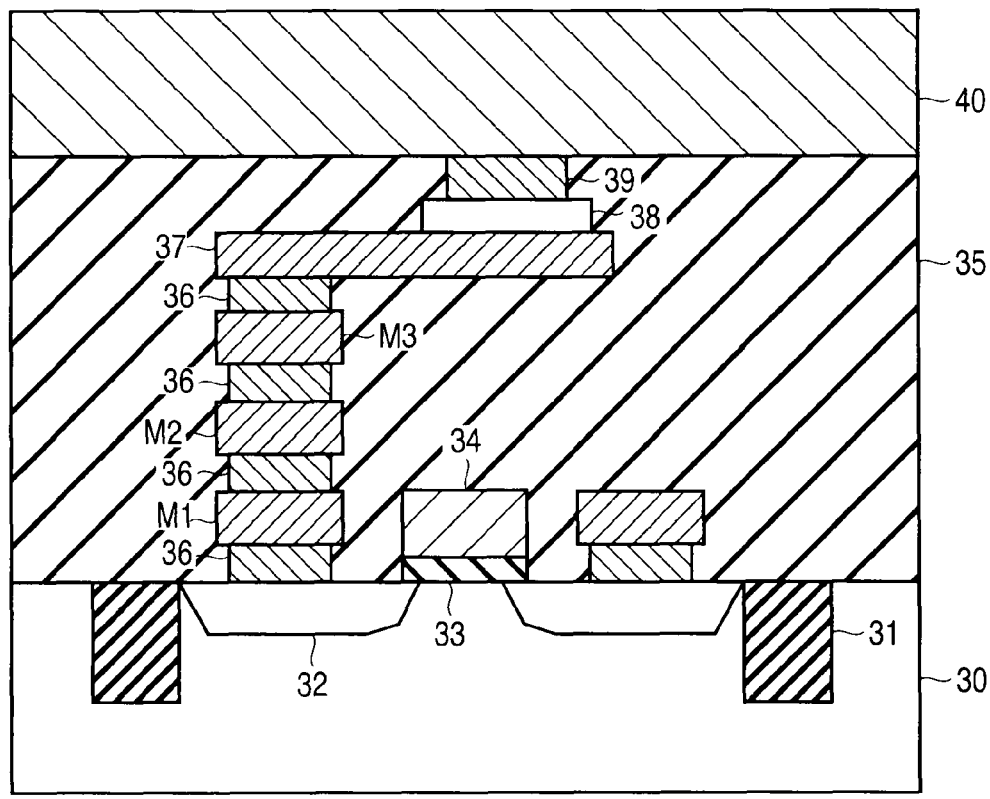
FIG. 12 is a sectional view showing a memory cell in an MRAM of an eighth embodiment.

FIG. 12 is a sectional view showing the structure of the memory cell in the MRAM of the eighth embodiment.

As shown in FIG. 12, the memory cell in the MRAM of the eighth embodiment has a structure in which an electrode layer, polycrystalline metal underlying interconnection 37, magnetoresistive element 38, and metal via (or metal hard mask) 39 are sequentially formed on a transistor formed on a semiconductor substrate 30, and a bit line 40 is formed on the metal via 39.

The structure of the memory cell in the MRAM will be described in detail below. Element isolation regions 31 are formed in the silicon semiconductor substrate 30, and source and drain regions 32 are formed in the semiconductor substrate sandwiched between the element isolation regions 31. A gate insulating film 33 is formed on the semiconductor substrate 30 between the source and drain regions. A gate electrode 34 is formed on the gate insulating film 33. Also, an interlayer dielectric film 35 is formed on the semiconductor substrate 30. In the interlayer dielectric film 35 on the source or drain region 32, first, second, and third interconnections M1, M2, and M3 are formed with contact plugs 36 formed between them. The polycrystalline metal underlying interconnection 37 is formed on the contact plug 36 on the third interconnection M3. The magnetoresistive element 38 is formed on the polycrystalline metal underlying interconnection 37. In addition, the metal via (or metal hard mask) 39 is formed on the magnetoresistive element 38, and the bit line 40 is formed on the metal via 39.

In the eighth embodiment, an MRAM including a magnetoresistive element having a high magnetoresistance change ratio can be implemented by using the magnetoresistive element of each embodiment described above.

Ninth Embodiment

A magnetic head of the ninth embodiment of the present invention will be explained below. This magnetic head is formed using the magnetoresistive element of each of the above embodiments, and used in a hard disk drive (HDD).

FIG. 13 is a sectional view showing the structure of the magnetic head of the ninth embodiment. As shown in FIG. 13, the magnetic head has a structure in which a magnetoresistive element 43 is formed between a lower electrode layer 41 and upper electrode layer 42.

In the ninth embodiment, a magnetic head including a magnetoresistive element having a high magnetoresistance change ratio can be implemented by using the magnetoresistive element of each of the above-mentioned embodiments.

In each embodiment explained above, it is possible to use a semiconductor substrate having Si single crystal, Ge single crystal, or Si—Ge single crystal as the substrate material, a silicon-on-insulator (SOI) substrate, a III-V compound semiconductor substrate made of, e.g., GaAs or InGaAs, or a II-VI semiconductor substrate. It is also possible to use an oxide substrate made of MgO, $SrTiO_3$, or $Al_2O_3$.

The present invention includes all of a spin transistor, a MESFET, an FET using a p-n junction, and another magnetoresistive device formed by changing the combinations of the individual embodiments explained above.

The embodiments of the present invention make it possible to provide a stack capable of increasing the degree of freedom of selection of an underlying layer on which a Heusler alloy is to be formed, decreasing the annealing temperature and the number of times of annealing, and using a high spin polarization of a Heusler alloy, a magnetoresistive element and spin transistor having an electrode structure capable of efficient spin-polarized current injection, and a method of manufacturing the same.

Also, the above-mentioned embodiments can be practiced singly and can also be practiced as they are appropriately combined. Furthermore, the above embodiments include inventions in various stages, so these inventions in the various stages can also be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stack comprising:
a crystalline MgO layer;
a crystalline Heusler alloy layer on the MgO layer; and
an amorphous Heusler alloy layer on the crystalline Heusler alloy layer.

2. The stack according to claim 1, wherein the crystalline Heusler alloy layer is a (001)-oriented layer.

3. The stack according to claim 1, wherein the crystalline Heusler alloy layer and the amorphous Heusler alloy layer include at least one element selected from the group consisting of B, C, P, S, As, Se, and Sb.

4. A magnetoresistive element comprising: a crystalline first Heusler alloy layer and a crystalline second Heusler alloy layer; a first MgO layer between the crystalline first Heusler alloy layer and the crystalline second Heusler alloy layer; and an amorphous third Heusler alloy layer on the first Heusler alloy layer at a surface opposite to a surface on the side of the first MgO layer.

5. The element according to claim 4, further comprising an amorphous fourth Heusler alloy layer on the second Heusler alloy layer at a surface opposite to a surface on the side of the first MgO layer.

6. The element according to claim 4, further comprising:
a crystalline fifth Heusler alloy layer between the first MgO layer and the second Heusler alloy layer; and
a second MgO layer between the fifth Heusler alloy layer and the second Heusler alloy layer.

7. The element according to claim 4, wherein the first Heusler alloy layer and the second Heusler alloy layer are (001)-oriented layers.

8. The element according to claim 4, wherein the first Heusler alloy layer, the second Heusler alloy layer, and the third Heusler alloy layer include at least one element selected from the group consisting of B, C, P, S, As, Se, and Sb.

9. A spin transistor comprising a source electrode, a drain electrode, and a gate electrode on a semiconductor substrate,
wherein at least one of the source electrode and the drain electrode has a stack comprising:
a crystalline MgO layer;
a crystalline Heusler alloy layer on the MgO layer; and
an amorphous Heusler alloy layer on the crystalline Heusler alloy layer.

10. The transistor according to claim 9, wherein the crystalline Heusler alloy layer is a (001)-oriented layer.

11. The transistor according to claim 9, wherein the crystalline Heusler alloy layer and the amorphous Heusler alloy layer include at least one element selected from the group consisting of B, C, P, S, As, Se, and Sb.

12. A stack manufacturing method comprising:
forming an amorphous Heusler alloy layer;
forming an MgO layer in contact with the Heusler alloy layer; and
crystallizing the Heusler alloy layer by annealing from an interface between the Heusler alloy layer and the MgO layer.

* * * * *